United States Patent
Ma et al.

(10) Patent No.: US 7,154,358 B2
(45) Date of Patent: Dec. 26, 2006

(54) FILM BULK ACOUSTIC RESONATOR STRUCTURE AND METHOD OF MAKING

(75) Inventors: Qing Ma, San Jose, CA (US); Li-Peng Wang, Santa Clara, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/942,147

(22) Filed: Sep. 16, 2004

(65) Prior Publication Data

US 2005/0030128 A1    Feb. 10, 2005

Related U.S. Application Data

(60) Division of application No. 10/109,811, filed on Mar. 28, 2002, now Pat. No. 6,822,535, which is a continuation-in-part of application No. 10/023,591, filed on Dec. 17, 2001, now abandoned.

(51) Int. Cl.
*H03H 9/17* (2006.01)
*H03H 9/205* (2006.01)
*H03H 9/54* (2006.01)

(52) U.S. Cl. ............... 333/187; 333/189; 310/322; 310/367; 310/368

(58) Field of Classification Search ......... 333/187–192
See application file for complete search history.

(56) References Cited

U.S. PATENT DOCUMENTS 5,714,917 A   2/1998   Ella
5,801,603 A   9/1998   Yamamoto et al. ......... 333/189
5,815,054 A   9/1998   Vojak et al. ................ 333/191
6,606,772 B1  8/2003   Nohara et al. ............. 29/25.35
6,822,535 B1  11/2004  Ma et al.

FOREIGN PATENT DOCUMENTS

| | | |
|---|---|---|
| EP | 0823781 | 2/1998 |
| GB | 02-106346 | 4/1983 |
| JP | 10-341125 | 12/1998 |
| JP | 2001-44794 | 2/2001 |

*Primary Examiner*—Barbara Summons
(74) *Attorney, Agent, or Firm*—Schwegman, Lundberg, Woessner & Kluth, P.A.

(57) ABSTRACT

A film bulk acoustic resonator is formed on a substrate having a major surface. The film bulk acoustic resonator includes an elongated stack. The elongated stack includes a layer of piezoelectric material positioned between a first conductive layer deposited on a first surface of the layer of piezoelectric material, and a second conductive layer deposited on a second surface of the layer of piezoelectric material. The elongated stack is positioned substantially perpendicular with respect to the major surface of the substrate. The first and second conductive layers are placed on the layer of piezoelectric material substantially simultaneously and in one processing step. The major surface of the substrate is in a horizontal plane and the stack of the film bulk acoustic resonator is in a substantially vertical plane. The resonator structure formed may be used either as a resonator or a filter.

19 Claims, 11 Drawing Sheets

FILM BULK ACOUSTIC RESONATOR STRUCTURE AND METHOD OF MAKING

This application is a divisional of U.S. application Ser. No. 10/109,811, filed on Mar. 28, 2002, now issued as U.S. Pat. No. 6,822,535; which is a continuation-in-part of U.S. application Ser. No. 10/023,591, filed Dec. 17, 2001, now abandoned.

FIELD OF THE INVENTION

The present invention pertains to forming a film bulk acoustic resonator ("FBAR") structure. More specifically, the present invention relates to the methods of forming a plurality of film bulk resonator structures on a substrate and relates to the structure of the film bulk resonator.

BACKGROUND OF THE INVENTION

In some instances it is desirable to provide a radio frequency front-end filter. Ceramic filters and saw filters are used as front-end radio frequency filters, ceramic filters and saw filters still dominate, but there are problems with ceramic filters and saw filters. Saw filters start to have excessive insertion loss above 2.4 gigahertz (GHz). Ceramic filters are large in size and can only be fabricated with increasing difficulty as the frequency increases.

FBARs have replaced ceramic filters and saw filters in limited cases. The FBARs have better performance than ceramic filters and saw filters. A basic FBAR device 100 is schematically shown in FIG. 1. The FBAR device 100 is formed on the horizontal plane of a substrate 109. A first layer of metal 120 is placed on the substrate 109, and then a piezoelectric layer (AlN) 130 is placed onto the metal layer 120. A second layer of metal 122 is placed over the piezoelectric layer 130. The first metal layer 120 serves as a first electrode 120 and the second metal layer 122 serves as a second electrode 122. The first electrode 120, the piezoelectric layer 130, and the second electrode 122 form a stack 140. A portion of the substrate 109 behind or beneath the stack 140 is removed using backside bulk silicon etching. The backside bulk silicon etching is done using deep trench reactive ion etching or using a crystallographic-orientation-dependent etch, such as KOH, TMAH, and EDP. Backside bulk silicon etching produces an opening 150 in the substrate 109. The resulting structure is a horizontally positioned piezoelectric layer 130 sandwiched between the first electrode 120 and the second electrode 122 positioned above the opening 150 in the substrate. The FBAR is a membrane device suspended over an opening in a horizontal substrate.

FIG. 2 illustrates the schematic of an electrical circuit 200 which includes a film bulk acoustic resonator 100. The electrical circuit 200 includes a source of radio frequency "RF" voltage 210. The source of RF voltage 210 is attached to the first electrode 120 via electrical path 220 into the second electrode 122 by the second electrical conductor 222. The entire stack 140 can freely resonate in the Z direction ("$D_{33}$" mode) when the RF voltage at resonant frequency is applied. The resonant frequency is determined by the thickness of the membrane or the thickness of the piezoelectric layer 130 which is designated by the letter d or dimension d in FIG. 2. The resonant frequency is determined by the following formula:

$f_0 \sim V/2d$, where $f_0$ = the resonant frequency,

V = the acoustic velocity in the Z direction, not the voltage, and d = the thickness of the piezoelectric layer.

It should be noted that the structure described in FIGS. 1 and 2 can be used either as a resonator or as a filter. However, such a structure has many problems. For example, as the thickness of the layers are reduced, then the resonance frequency of the device will be increased. A filter to be used in a high frequency application requires a thin membrane. Thin membrane devices are very fragile.

The backside bulk silicon etching produces a wafer having large openings therein. Wafers with large openings therein are much weaker than a wafer without openings therein. The wafers with large openings therein are much more difficult to handle without breaking.

The membrane device that results also must be protected on both sides of the wafer. As a result, the packaging costs associated with the FBAR membrane devices are higher than a device that must be protected on one side only.

Still a further disadvantage is that backside bulk etching of silicon is a slow process with significant yield problems. In addition, the equipment and processes needed to conduct a backside bulk etching of silicon differs from the equipment and processes used in standard integrated circuit processing which add to the cost of production and is less compatible with standard integrated circuit production.

Thus, there is general need for an FBAR device and a method for producing one or more FBAR devices that is more compatible with standard processes associated with standard integrated circuit processing techniques. The is also a general need for a FBAR device that is more durable. There is still a further need for an FBAR device that can be formed for high frequency applications which does not use as much area of a wafer as current FBAR devices. There is also a general need for a FBAR device that does not have to be protected on both sides so that packaging costs associated with the device are less. There is also a need for a process which keeps the wafers stronger during production so that the wafers are easier to handle during production.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 1:
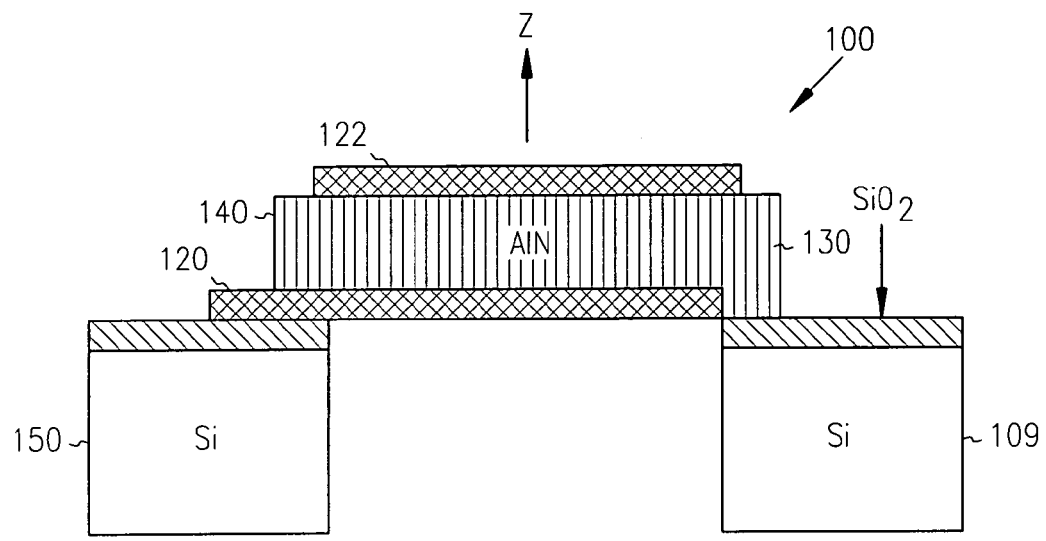
FIG. 1 illustrates a cross sectional view of a prior art film bulk acoustic resonator.
Figure 2:
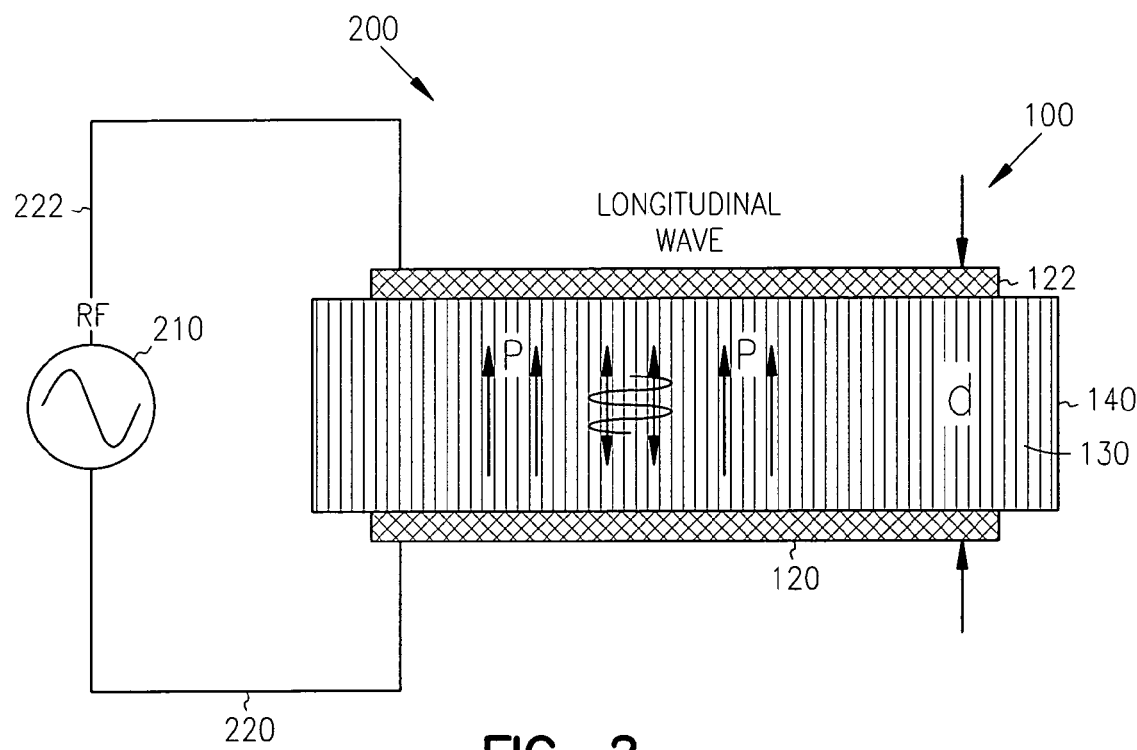
FIG. 2 illustrates a schematic of an electrical circuit of a film bulk acoustic resonator.
Figure 3:
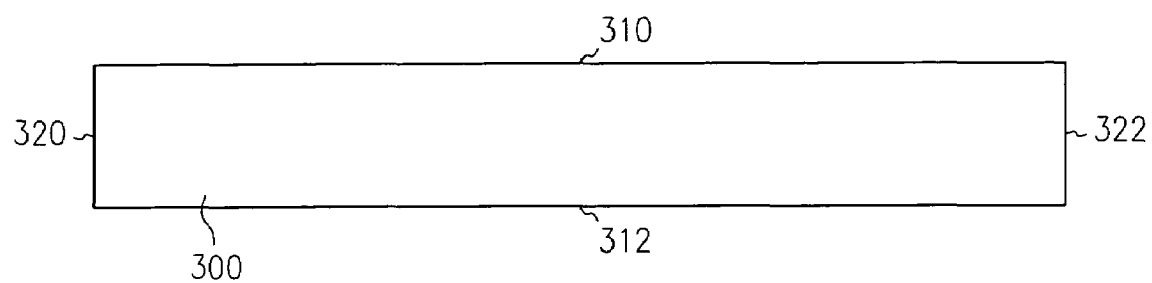
FIG. 3 illustrates a substrate or wafer from which the invention is made.

Described in FIGS. 3–17 are the various process steps used to make the inventive film bulk acoustic resonator "FBAR." FIG. 3 illustrates a substrate or wafer 300 from which the invention is made. Typically the substrate provided is a substrate having Miller indices of <110>. The substrate includes a horizontal surface 310, a horizontal surface 312, a vertical surface 320 and a vertical surface 322. The designations of horizontal and vertical indicate that the horizontal surfaces may be substantially horizontal and may be substantially parallel to one another and that the vertical surfaces 320, 322 are substantially vertical with respect to the horizontal surfaces 310, 312. It could also be said that the vertical surfaces 320, 322 are substantially perpendicular to the horizontal surfaces 310, 312 of the substrate 300. It should be noted that the view shown in FIG. 3 is a cut-away side view of the substrate or wafer 300.

Figure 4:
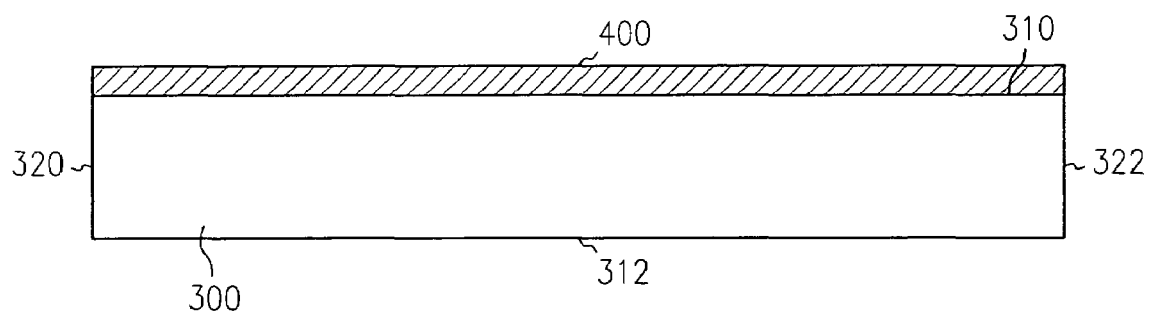
FIG. 4 illustrates a substrate or wafer with a layer of photolithographic material thereon.

FIG. 4 illustrates the substrate or wafer 300 with a layer of photolithographic material placed on horizontal surface 310. A layer of photoresist 400 is spun onto the wafer 300. A mask is then placed between a UV light source and the substrate 300. The mask has openings therein and is used to selectively expose the substrate and more particularly the layer of photoresist to the UV light. The exposed portion can then be removed by developing the photoresist. It should be noted that a positive photoresist process is described here. However, a negative photoresist process could also be used.

Figure 5:
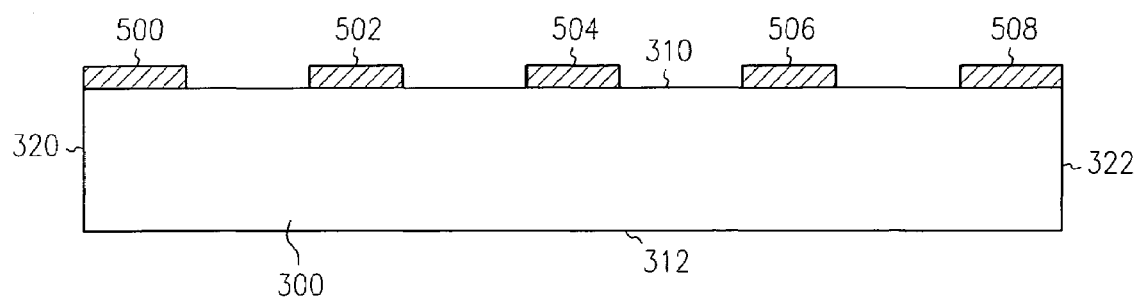
FIG. 5 illustrates a substrate or wafer after the a portion of the photolithographic material has been removed.

FIG. 5 illustrates the substrate 300 after a portion of the photolithographic material 400 has been removed. In other words after the photoresist has been developed and a portion has been removed, portions of the photoresistive layer remain in contact with the horizontal surface 310 of the substrate 300. The portions of the photoresist that remain after developing the layer of photoresist 400 include portions 500, 502, 504, 506, and 508.

Figure 6:
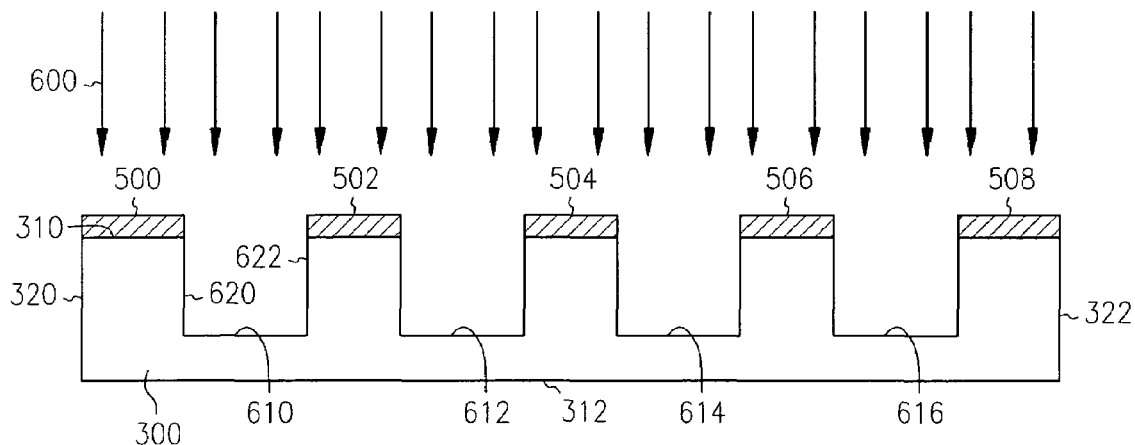
FIG. 6 illustrates a cutaway portion of a substrate in accordance with an embodiment of the present invention during a step of fabrication where trenches are made.

FIG. 6 illustrates a cut-away view of the substrate 300 in accordance with an embodiment of the present invention during the next step of fabrication. The substrate 300, as shown in FIG. 5, is subjected to an etching process where. portions of the substrate 300 between the portions of the photoresist 500, 502, 504, 506, 508 are removed. The etching process is depicted by the series of arrows 600 shown in FIG. 6. The etching process can be reactive ion etching, ion milling, a dry or plasma etch a wet chemistry-liquid/vapor etch or any other suitable process for removing portions of the substrate. Removing portions of the substrate results in a series of trenches 610, 612, 614, and 616. Each of the trenches includes a first sidewall 620 and a second sidewall 622. The sidewall 620, 622 of each of the trenches 610, 612, 614, 616 are substantially vertical with respect to the horizontal surfaces 310, 312 of the substrate 320. The substrate is formed from a silicon or silicon carbon, "Si or SiC," in which the horizontal surface 310 has a Miller index of <110>. The trenches are oriented perpendicular to a direction having a Miller index of <111>. As a result the two sidewalls 620, 622 of each of the trenches 610, 612, 614, 616 present a surface having a Miller index of <111>.

Figure 7:
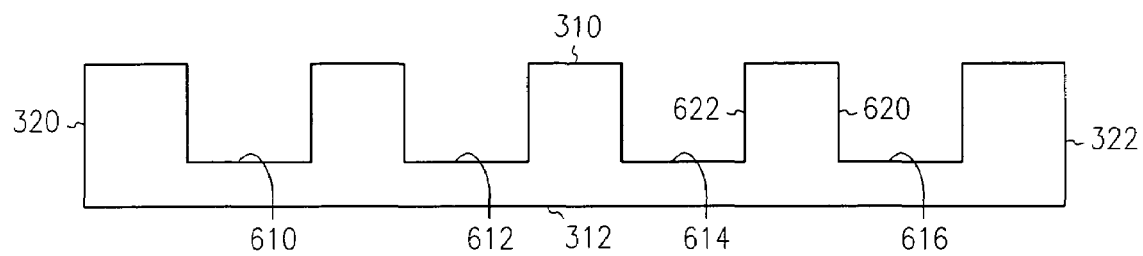
FIG. 7 illustrates the cutaway portion of the substrate in accordance with an embodiment of the present invention after the trenches are made and after the photolithographic material has been removed.

The next step, as shown in FIG. 7, is to remove the photolithographic material 500, 502, 504, 506, 508. This leaves the substrate 300 and trenches 610, 612, 614 and 616. Again, the sidewalls of each of the trenches 610, 612, 614, 616 have a Miller index of <110>.

Figure 8:
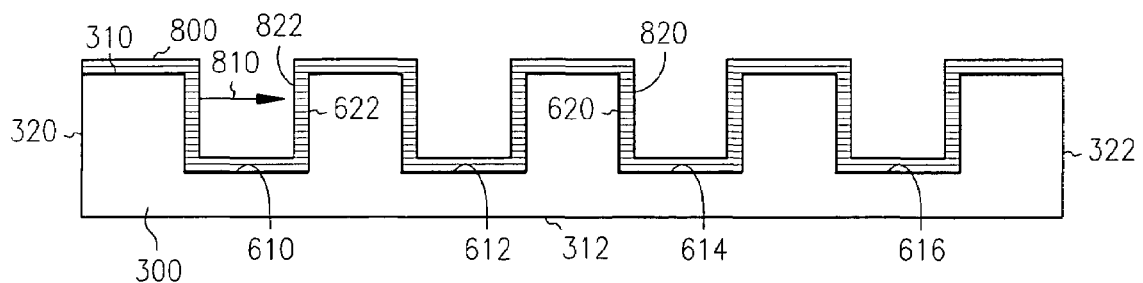
FIG. 8 illustrates the cutaway portion of the substrate in accordance with an embodiment of the present invention, as a piezoelectric material is grown onto the sidewalls of the trenches and onto the horizontal surfaces of the substrate.

Now turning to FIG. 8, the next step includes drawing a piezoelectric layer 800 on the horizontal surface 310 of the substrate as well as on the bottom surface and sidewalls 620, 622 of each of the trenches 610, 612, 614, 616. The piezoelectric material that is grown in this particular embodiment is aluminum nitrate (AlN). The two sidewalls 620, 622 of each of the trenches 610, 612, 614, 616 are orientated perpendicular to <111>. A single crystalline AlN film is grown on the sidewalls. Each of the single crystalline films on the sidewall 620, 622 has an axis, c, which is perpendicular to the sidewall surface 620, 622. The c axis is shown or depicted by reference numeral 810. The portion of the piezoelectric material 800 which is a single crystal and grown on the sidewalls 620, 622 of each of the trenches 610, 612, 614, 616 is depicted by reference numeral 822 for single layer crystals grown on sidewalls 622 of each of the trenches and by reference numeral 820 for single crystal piezoelectric material grown on the sidewalls 620 of each of the trenches 610, 612, 614, 616. It should be noted that the piezoelectric film grown on the lateral surfaces or at the bottoms of each of the trenches need not be a single crystalline structure.

Figure 9:
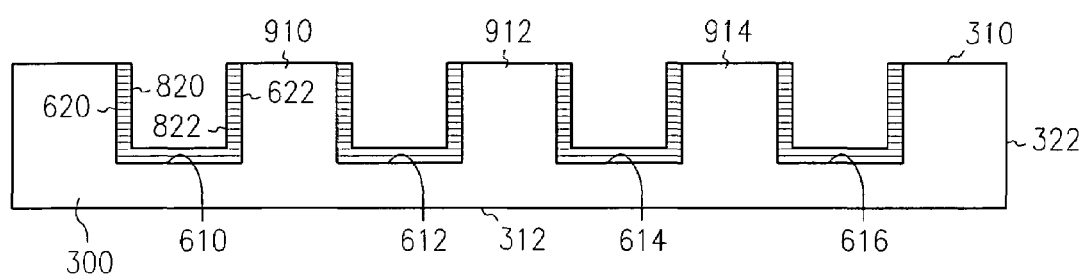
FIG. 9 illustrates the cutaway portion of the substrate in accordance with an embodiment of the present invention during the step of fabrication where the piezoelectric material is removed from the top horizontal surface of the substrate.

The next step, as depicted by FIG. 9, is to remove the piezoelectric layer portion on the surface 310 of the substrate. In one embodiment, a chemical/mechanical polish (CMP) is used to remove the piezoelectric material (AlN) on surface 310 of the substrate 300. It should be noted that it is also possible to use directional etching to remove the piezoelectric material (AlN) that are not on the sidewalls 620, 622 of the trenches 610, 612, 614, 616.

It should be noted that between each trench 610, 612, 614, 616, there is a portion of substrate material 910, 912, 914 which is located between the trenches.

Figure 10:
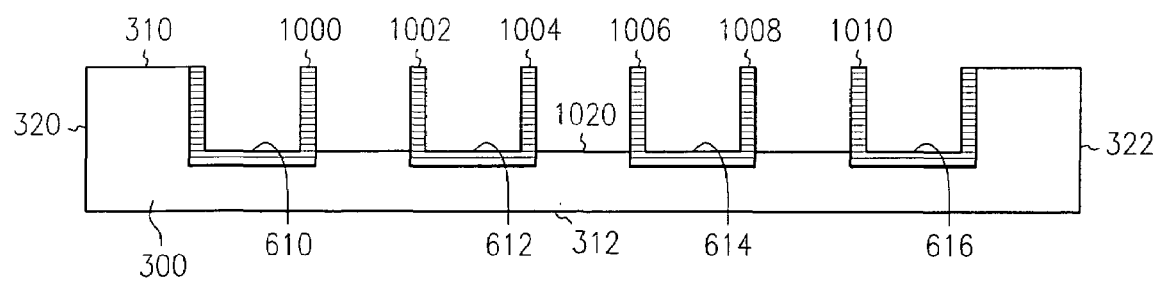
FIG. 10 illustrates the cutaway portion of the substrate after the substrate material between the trenches has been removed.

The next step in the process which is illustrated by FIG. 10 is to remove the substrate material between the trenches. In other words, the substrate material 910, 912, 914 between the trenches shown in FIG. 9 is removed to produce a series of free-standing single crystal piezoelectric structures. By removing the portions 910, 912, 914 shown in FIG. 10 between the trenches 610, 612, 614, 616, the sidewalls of the trenches are essentially removed, leaving free-standing single crystal piezoelectric structures 1000, 1002, 1004, 1006, 1008 and 1010.

Figure 11:
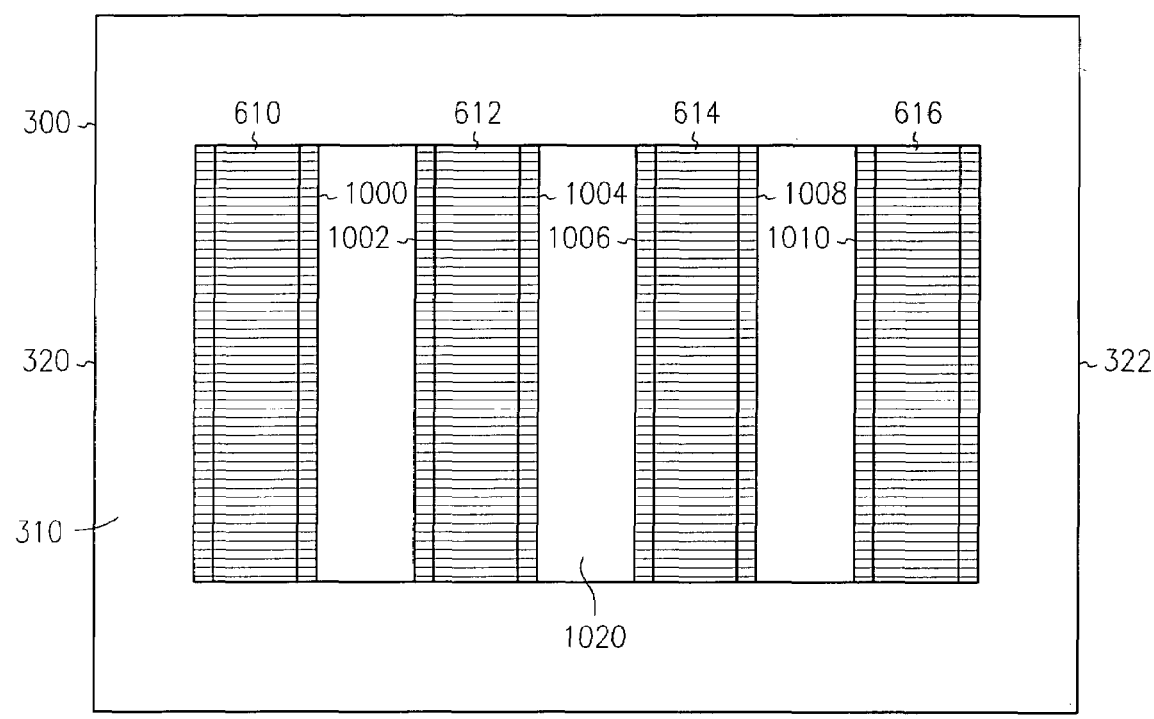
FIG. 11 illustrates a top view of a portion of the substrate in accordance with an embodiment of the present invention shown in FIG. 10.

FIG. 11 illustrates a top view of the substrate 300 shown in FIG. 10. Removal of the substrate portions 910, 912, 914 produces a recessed region 1020 within the substrate 300. The recessed region 1020 is bounded by the surface 310 around the periphery of the substrate 300. As can be seen, the free-standing single crystal structures are elongated structures that run the length of the recessed region. The single crystal piezoelectric structures 1000, 1002, 1004, 1006, 1008 and 1010 are also substantially vertical with respect to the surface 310 of the substrate as well as the surface defining the recess 1020. The substrate portions 910, 912, 914 are removed using lithography and an etch. The photolithographic material protects most of the substrate with the exception of the areas 910, 912, 914 located between the trenches 610, 612, 614, 616.

Figure 12:
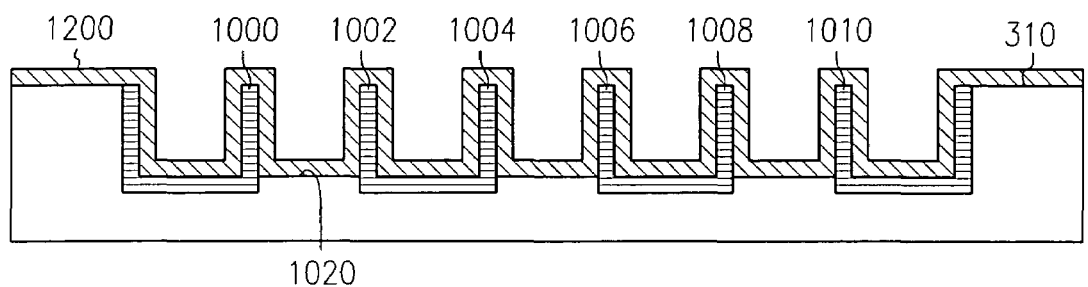
FIG. 12 illustrates the cutaway portion of the substrate in accordance with an embodiment of the present invention after the step of fabrication where an isolative or dielectric layer has been placed over the structure formed.

The next step, as depicted by FIG. 12, is to deposit a dielectric material (SiO$_2$) over the entire surface of the substrate including surface 310 and the surface of the recess 1020 as well as over each of the free-standing piezoelectric elements 1000, 1002, 1004, 1006, 1008, 1010. This is necessary if the substrate is conductive or will react with metal.

Figure 13:
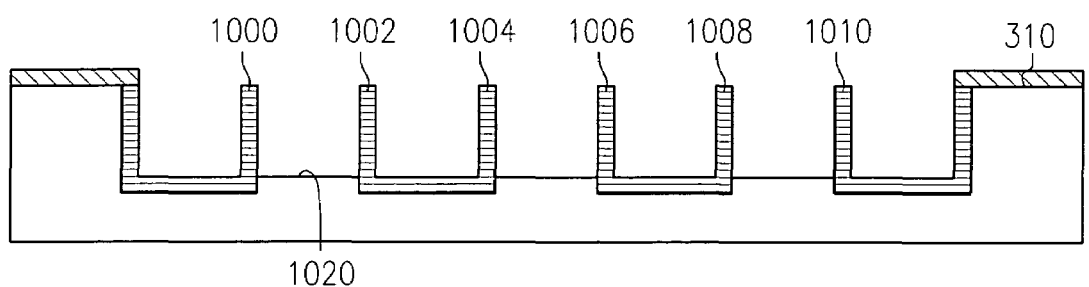
FIG. 13 illustrates the cutaway portion of the substrate in accordance with an embodiment of the present invention after the step of fabrication where portions of the dielectric or isolative material have been removed.
Figure 14:
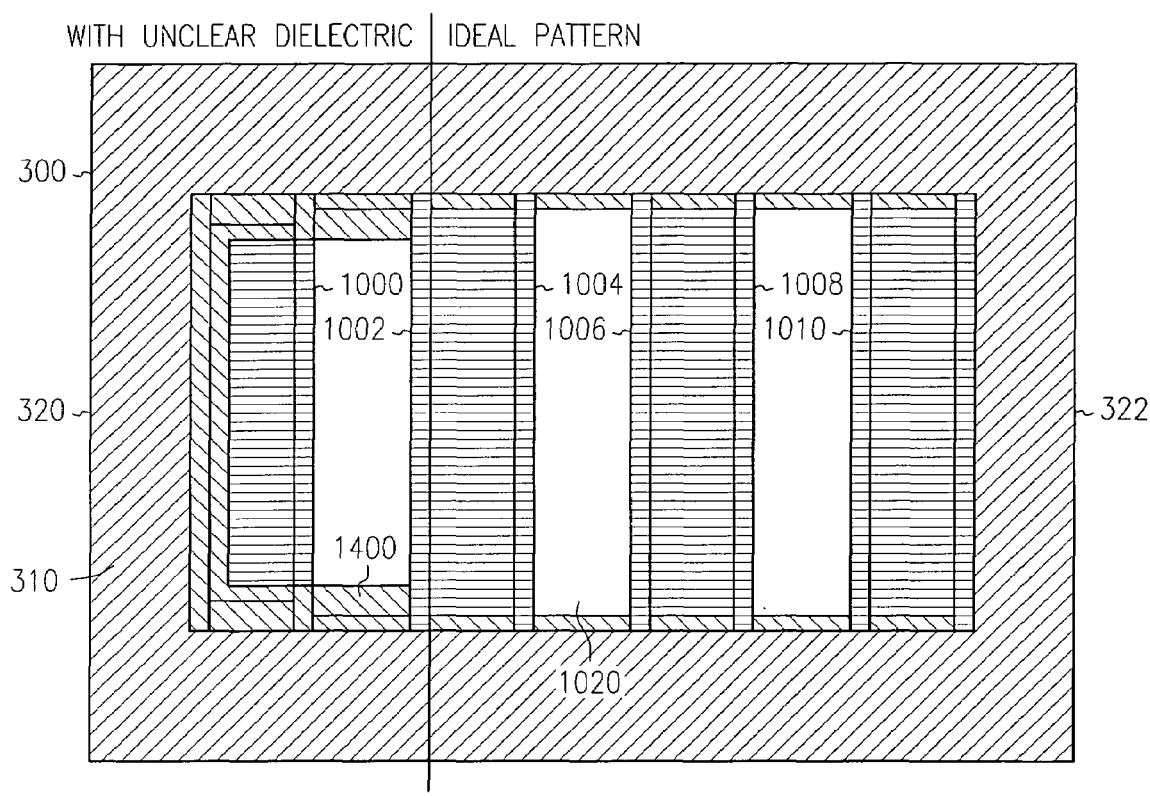
FIG. 14 illustrates a top view of the substrate in accordance with an embodiment of the present invention shown in FIG. 13.

The next step, as depicted by FIGS. 13 and 14, is to remove the dielectric material on the sidewalls of the free-standing piezoelectric elements 1000, 1002, 1004, 1006, 1008, 1010. This can also be thought of in a different way in that the dielectric material is substantially removed from the portions of the substrate within the recess 1020. It should be noted that it is not necessary to remove all the dielectric material from the recess or from the free-standing piezoelectric elements 1000, 1002, 1004, 1006, 1008, 1010. Dielectric material remains on surface 310. In other words, dielectric material substantially covers surface 310 of the substrate 300. It is acceptable to have some uncleared dielectric material within the recessed area 1020. The uncleared dielectric material is typically on the edges of the recess 1020 near the surface 310. In other words, the uncleared material may be about the periphery of the recess 1020 within the chip 300. The dielectric material is removed using photolithography and a wet etch. The uncleared dielectric material such as shown as element number 1400 in FIG. 14, may be uncleared due to the lack of precision shown in the photolithography/resist step due to the depth of the recess 1020.

The surface 310 is a major surface of the substrate.

Figure 15:
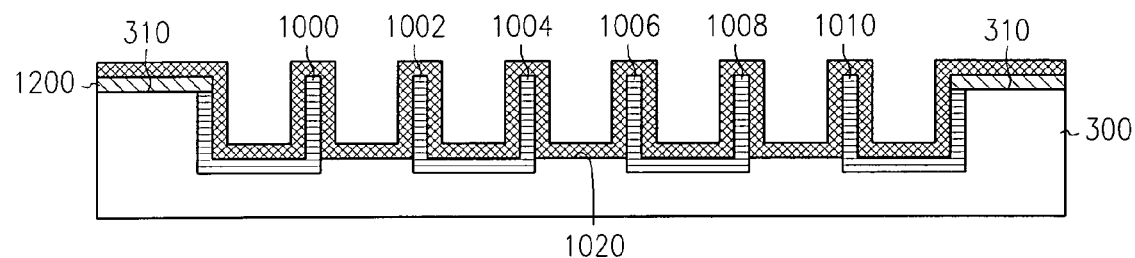
FIG. 15 illustrates a cutaway portion of the substrate after the step of fabrication where the freestanding piezoelectric portions have had metal deposited thereon.

The next step is to deposit metal onto the substrate, as depicted by FIG. 15. The metal is deposited onto surface 310 and specifically onto the dielectric material 1200 on surface 310 as well onto the surface of the recess 1020 as well as onto the free-standing piezoelectric elements 1000, 1002, 1004, 1006, 1008, 1010. The metallic layer of the metal deposited is depicted by reference numeral 1500.

Figure 16:
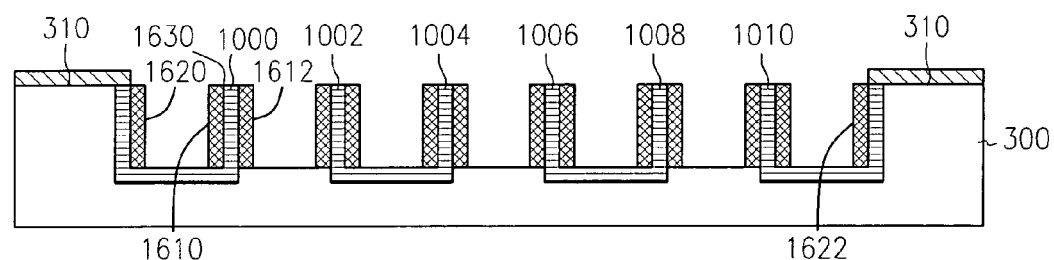
FIG. 16 illustrates a cutaway portion of the substrate after the step of fabrication where the metal deposited on the top or free end of the piezoelectric element has been removed.
Figure 17:
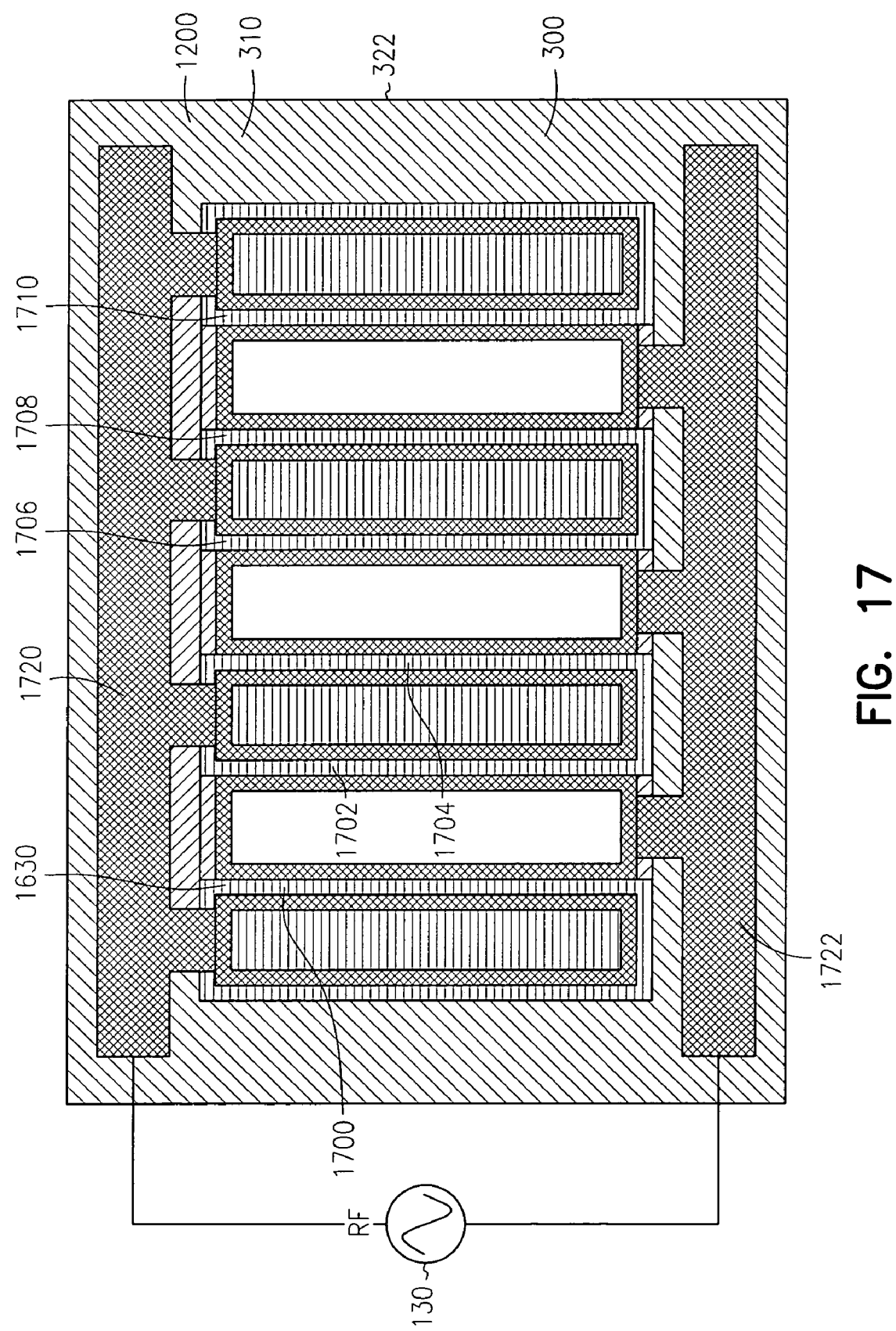
FIG. 17 illustrates a top view of the device after the step of fabrication where the freestanding piezoelectric portions have had metal deposited thereon and the electrical contacts have been placed onto the dielectric or isolative material.

The next step as shown in FIGS. 16 and 17 is to use photolithography and etching to produce a pattern of signal connections as well as metal on the sidewalls of each of the free-standing piezoelectric elements 1000, 1002, 1004, 1006, 1008, 1010. The photolithography and etching removes the metal material from the tops of the piezoelectric elements 1000, 1002, 1004, 1006, 1008, 1010 and etching also removes the metal layer 1500 between each of the free-standing piezoelectric elements 1000, 1002, 1004, 1006, 1008, 1010. The metallic layer between the sidewall 1620, 1622 of the recessed area 1020 and the piezoelectric element 1000, 1010, respectively. The result is that each of the piezoelectric elements 1000, 1002, 1004, 1006, 1008 and 1010 has a metal layer on each of its sidewalls. For example, looking at the single crystal piezo element 1000 has a first conductive layer 1610 deposited upon a first surface of the piezoelectric material 1000 and a second conductive layer 1612 deposited upon a second surface of the piezoelectric material 1000. Each of the free-standing piezoelectric elements 1000, 1002, 1004, 1006, 1008, 1010, each has first and second conductive layers deposited upon their surface. The first conductive layer 1610 becomes a first electrode and the second conductive layer 1612 becomes a second electrode. The end result is that each piezoelectric element 1000, 1002, 1004, 1006, 1008, 1010 is sandwiched between a first electrode 1610 and a second electrode 1612. For the sake of simplicity, only the first piezoelectric element 1000 is shown with reference numeral.

It should be understood and is illustrated that each of the piezoelectric elements 1000, 1002, 1004, 1006, 1008, 1010 is bounded by a first and second electrode. Thus, the first electrode 1610, the elongated single crystal piezoelectric element 1000 and the second electrode 1612 form a stack 1630. Thus, the stack 1630 is also substantially vertically oriented with respect to the surface 310 of the substrate and with respect to the surface forming the bottom portion of the recess 1020. The result of the lithography and etching away of metal is also to form a pattern for interconnecting each of the stacks which are formed. The stacks can also be looked upon as individual film bulk acoustic resonators 1700, 1702, 1704, 1706, 1708, 1710. The pattern formed also includes electrical contacts which connect the electrodes 1610 on FBARs 1700, 1704 and 1708 and electrodes 1612 on FBARs 1702 and 1706. This electrical contact is designated as 1720 and is formed on the surface 310 of the substrate 300. A second metallic pattern used to connect the signals to the various FBAR resonators is formed on the opposite end of the resonators. The electrical contact 1722 connects the electrode 1612 of resonators 1700, 1704 and 1708 as well as the electrode 1610 of resonator 1702 and resonator 1706 and resonator 1710. Electrical contact 1720 and electrical contact 1722 are electrically connected to an RF signal generating device depicted by reference numeral 1730 in FIG. 17.

The result of the process shown in FIGS. 3–17 is a structure also shown in FIGS. 16 and 17. The result is vertically free-standing piezoelectric films made and provided with electrodes on each side so that vertically standing FBAR devices can be formed on a substrate. Also shown is a uniform single piezoelectric film can be grown on sidewalls of trenches to form a single crystal substrate piezo material. In essence, film bulk acoustic resonators can be formed to be vertically orientated with respect to the major or horizontal surface 310 of a substrate. The FBARs are vertically oriented and require less real estate on a particular substrate. It should be noted that although described above are a number of resonant FBAR devices formed in a parallel configuration, another structure could be easily formed of similar FBARs which include FBARs in series. In addition, 6 FBAR devices are shown in the figures. It should be understood that more or less FBARs can be formed using the techniques described above.

This structure has many advantages. Since a single crystal structure can be used to form the FBARs, this resonator or filter has a thickness which is reduced so that high frequency devices can be formed. In addition, due to the vertical orientation of the FBARs, there is less requirement for real estate on a per wafer basis. Other advantages include that there is no back side bulk etching required which tends to make the resulting device or substrate weaker and more fragile and more prone to breaking due to handling. Since there is no back side etching required, the packaging costs go down because now it's only necessary to package the FBARs formed by this invention on one side of the substrate, thus the packaging costs associated with the inventive FBAR structure and methods for forming the same are less. In addition, the FBARs formed using this process are formed with integrated circuit processing techniques which are compatible with standard integrated circuit production. The result of this is that less specialized equipment is needed and standard processes can be used so that the cost of production is lower and the time for production is also lower. The end result of this process and the structure that results is that you can produce FBARs on a single substrate using less real estate and producing a more reliable component which uses processes and techniques more compatible with standard IC processing.

Figure 18:
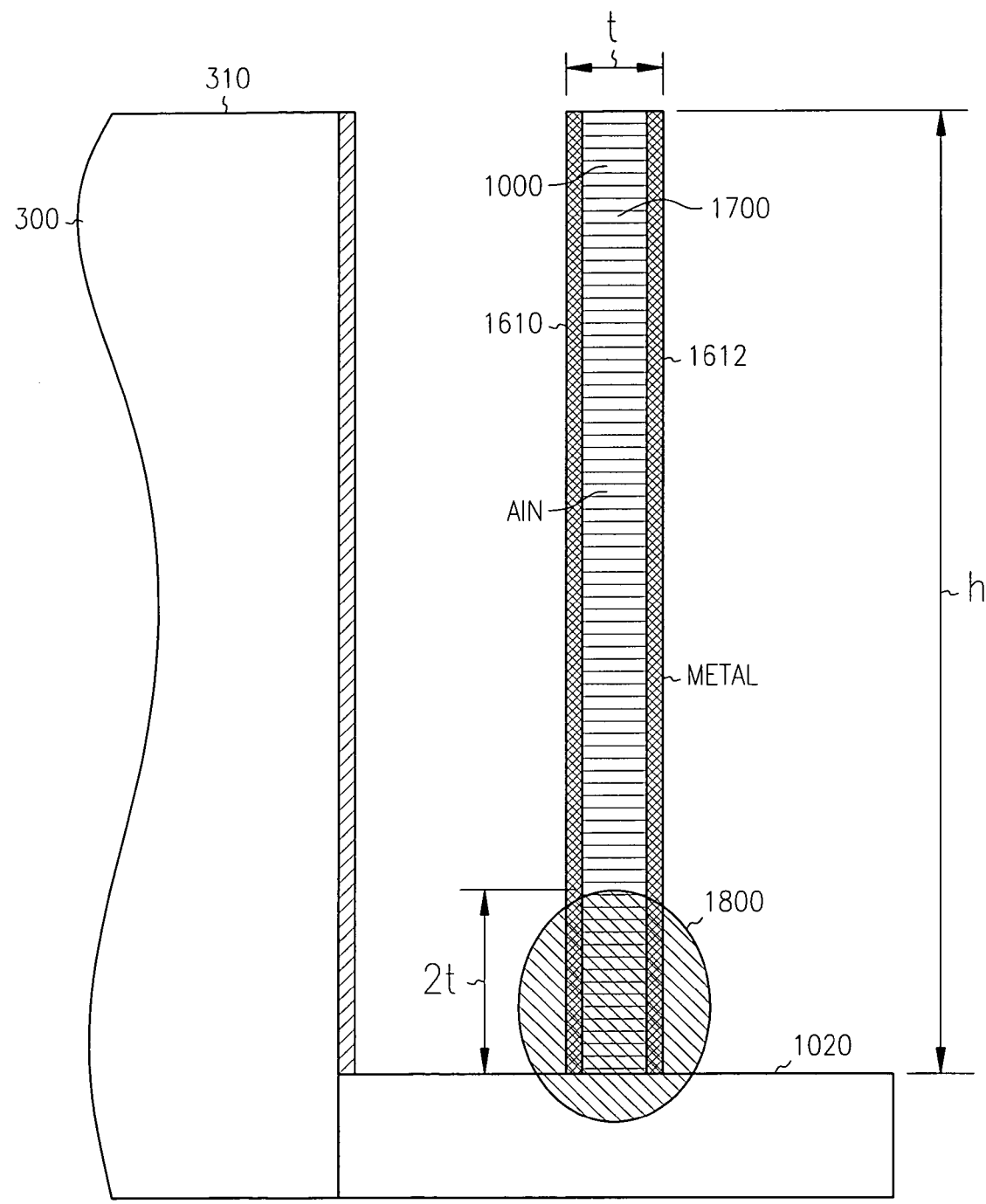
FIG. 18 illustrates a cutaway portion of one of the film bulk acoustic resonators of the device.

Now turning to FIG. 18, the aspect ratio of each of the stacks 1700, 1702, 1704, 1706, 1708, 1710, will now be discussed. FIG. 18 illustrates a cut-away portion of one of the film bulk acoustic resonators 1700 of the device shown in FIG. 17. The stack or FBAR has a thickness denoted by T and has a height H. From a processing and mechanical integrity point of view, the height to the thickness of the FBAR should not be too large. In general, MIMS devices have shown that an aspect ratio (the height divided by the thickness) of approximately 50 is easy to achieve and mechanically sound. From the stand point from performance as well as the real estate considerations for minimizing the amount of substrate space needed to form an FBAR, the larger aspect ratio is better. Reaching close to the bottom of the FBAR 1700 or the portion of the FBAR which is attached to the bottom surface of the recess 1020, is influenced by the substrate or the connection point. The region of influence is approximately 1–2 times the thickness as depicted by the region 1800 shown in FIG. 18. It should be noted that the region 1800 has a dimension of approximately 2T or two times the thickness. In general, an aspect ratio in the range of 10–50 is preferred so that the substrate-influenced region 1800 is a small fraction of the total FBAR and has little effect on the overall performance. In addition, an aspect ratio of less then 50 is not so large as to impose processing difficulties or produce degradative mechanical integrity in the FBAR.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A film bulk acoustic resonator formed on a substrate having a major surface, the film bulk acoustic resonator comprising:
    an elongated stack further comprising;
        a layer of piezoelectric material;
        a first conductive layer deposited on a first surface of the layer of piezoelectric material; and
        a second conductive layer deposited on a second surface of the layer of piezoelectric material, the elongated stack positioned substantially perpendicular with respect to the major surface of the substrate;
    a dielectric layer positioned on the major surface of the substrate;
    a first electric contact in electrical communication with the first conductive layer; and
    a second electric contact in electrical communication with the second conductive layer.

2. The film bulk acoustic resonator of claim 1 wherein the stack is substantially rectangular and has a length and a width, the stack having a first edge associated having the length dimension and a second edge associated with the length dimension, one of the first edge or the second edge attached to a second major surface of the substrate.

3. The film bulk acoustic resonator of claim 2 wherein the other of the first edge or the second edge is free with respect to the substrate.

4. The film bulk acoustic resonator of claim 2 further comprising a third major surface, the first major surface having an opening therein, the opening including the second major surface, the third major surface of the substrate being solid.

5. A device formed on a substrate comprising:
    a first film bulk acoustic resonator element formed on the substrate;
    a second film bulk acoustic resonator element formed on the substrate, each of the first film bulk acoustic resonator element and the second film bulk acoustic resonator element having a major surface and further comprising:
    an elongated stack comprising;
        a layer of piezoelectric material;
        a first conductive layer deposited on a first surface of the layer of piezoelectric material; and
        a second conductive layer deposited on a second surface of the layer of piezoelectric material, the elongated stack positioned substantially perpendicular with respect to a major surface of the substrate, wherein the layer of piezoelectric material is different from the substrate;
    a dielectric layer positioned on the major surface of the substrate; and
    a conductor that couples
        one of the first conductive layer or the second conductive layer of the first film bulk acoustic resonator element, and
        one of the first conductive layer or the second conductive layer of the second film bulk acoustic resonator element.

6. The device formed on a substrate of claim 5 wherein the conductor includes a metallic pattern associated with the substrate.

7. The device formed on a substrate of claim 5 wherein the elongated stack of each of the first film bulk acoustic resonator element and the second film bulk acoustic resonator element is substantially rectangular and has a length and a width, the elongated stack of each of the first film bulk acoustic resonator element and the second film bulk acoustic resonator element having a first edge associated having the length dimension and a second edge associated with the length dimension, one of the first edge or the second edge attached to a second surface of the substrate.

8. The device formed on a substrate of claim 7 wherein the other of the first edge or the second edge of each elongated stack of the first film bulk acoustic resonator element and the second film bulk acoustic resonator element is free with respect to the substrate.

9. A device formed on a substrate comprising:
   a first film bulk acoustic resonator element formed on the substrate;
   a second film bulk acoustic resonator element formed on the substrate, each of the first film bulk acoustic resonator element and the second film bulk acoustic resonator element having a major surface and further comprising:
   an elongated stack comprising;
      a layer of piezoelectric material;
      a first conductive layer deposited on a first surface of the layer of piezoelectric material; and
      a second conductive layer deposited on a second surface of the layer of piezoelectric material, the elongated stack positioned substantially perpendicular with respect to a major surface of the substrate, wherein the layer of piezoelectric material is different from the substrate;
   a conductor that couples
      one of the first conductive layer or the second conductive layer of the first film bulk acoustic resonator element, and
      one of the first conductive layer or the second conductive layer of the second film bulk acoustic resonator element; and
   another conductor that couples
      the other of the first conductive layer or the second conductive layer of the first film bulk acoustic resonator element, and
      the other of the first conductive layer or the second conductive layer of the second film bulk acoustic resonator element.

10. The device formed on a substrate of claim 9 wherein the conductor and the another conductor are electrically isolated from one another.

11. A filtering device comprising:
   a substrate including;
      a first horizontal major surface; and
      a second horizontal major surface;
   a first stack further including;
      a first layer of piezoelectric material;
      a first conductive layer deposited on a first surface of the first layer of piezoelectric material; and
      a second conductive layer deposited on a second surface of the first layer of piezoelectric material; and
   a second stack further including;
      a second layer of piezoelectric material;
      a third conductive layer deposited on a first surface of the second layer of piezoelectric material; and
      a fourth conductive layer deposited on a second surface of the second layer of piezoelectric material, the first stack and the second stack positioned vertically with respect to the first and second horizontal surface;
   a dielectric layer placed on the first major surface of the substrate;
   a first electrical contact attached to the first conductive layer and the fourth conductive layer; and
   a second electrical contact attached to the second conductive layer and the third conductive layer.

12. A filtering device comprising:
   a substrate including;
      a first horizontal major surface; and
      a second horizontal major surface;
   a first elongated stack further including;
      a first layer of piezoelectric material formed on the substrate;
      a first conductive layer deposited on a first surface of the first layer of piezoelectric material; and
      a second conductive layer deposited on a second surface of the first layer of piezoelectric material; and
   a second elongated stack further including;
      a second layer of piezoelectric material formed on the substrate;
      a third conductive layer deposited on a first surface of the second layer of piezoelectric material; and
      a fourth conductive layer deposited on a second surface of the second layer of piezoelectric material, the first stack and the second stack positioned vertically with respect to the first and second horizontal surface; and
   a dielectric layer placed on the first major surface of the substrate.

13. The filtering device of claim 12 further comprising:
   a first electrical contact attached to the first conductive layer; and
   a second electrical contact attached to the second conductive layer.

14. The filtering device of claim 12 further comprising:
   a first electrical contact attached to the first conductive layer and the fourth conductive layer; and
   a second electrical contact attached to the second conductive layer and the third conductive layer.

15. The filtering device of claim 12 wherein the first stack and the second stack are connected to one of the first horizontal surface or the second horizontal surface.

16. The filtering device of claim 12 wherein the first layer of piezoelectric material is a single crystal piezoelectric film.

17. The filtering device of claim 12 wherein the first layer of piezoelectric material and the second layer of piezoelectric material are each a single crystal piezoelectric film.

18. The filtering device of claim 12 wherein the first stack and the second stack are connected along one edge to one of the first horizontal surface or the second horizontal surface.

19. The filtering device of claim 12 wherein the first stack and the second stack each have a first end and a second end, the first end of the first stack and the first end of the second stack connected to one of the first horizontal surface or the second horizontal surface, and the second end of the first stack and the second end of the second stack being free.

* * * * *